(12) United States Patent
Broeker

(10) Patent No.: US 9,068,266 B2
(45) Date of Patent: Jun. 30, 2015

(54) DOOR ASSEMBLY FOR SUBSTRATE PROCESSING CHAMBER

(75) Inventor: Justin Broeker, Glendale, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 816 days.

(21) Appl. No.: 12/577,647

(22) Filed: Oct. 12, 2009

(65) Prior Publication Data

US 2010/0167544 A1 Jul. 1, 2010

Related U.S. Application Data

(60) Provisional application No. 61/142,121, filed on Dec. 31, 2008.

(51) Int. Cl.
*H01L 21/306* (2006.01)
*C23F 1/08* (2006.01)
*F16K 3/02* (2006.01)
*H01L 21/67* (2006.01)

(52) U.S. Cl.
CPC ............... *C23F 1/08* (2013.01); *F16K 3/0218* (2013.01); *H01L 21/67126* (2013.01)

(58) Field of Classification Search
CPC .......... H01L 21/67126; F16K 3/0218
USPC .............. 156/345.31; 118/733; 251/326, 328
See application file for complete search history.

(56) References Cited

U.S. PATENT DOCUMENTS

| | | | |
|---|---|---|---|
| 2003/0129044 A1* | 7/2003 | Kunze et al. | 414/217 |
| 2005/0184270 A1* | 8/2005 | Aggarwal et al. | 251/326 |
| 2006/0182534 A1* | 8/2006 | Hiroki | 414/217 |
| 2008/0092806 A1* | 4/2008 | West et al. | 118/70 |
| 2009/0255324 A1* | 10/2009 | Ishibashi et al. | 73/31.04 |

OTHER PUBLICATIONS

"Rainbow Style Gate Valve," Continuous Improvement, Lam Research Corporation, 2002, 2 pages.

* cited by examiner

*Primary Examiner* — Parviz Hassanzadeh
*Assistant Examiner* — Nathan K Ford
(74) *Attorney, Agent, or Firm* — Seed IP Law Group PLLC

(57) ABSTRACT

A substrate processing apparatus includes an enclosure defining a reaction chamber, a substrate holder in the reaction chamber, and a door assembly. The door assembly has a substrate entrance with a tunnel extending to the reaction chamber, a door movable with respect to the substrate entrance, and a pattern of features. The features are located along a portion of the substrate entrance defining the tunnel. The features promote sticking of processing byproducts, produced in the reaction chamber, to the substrate entrance. A door mates with the entrance to form a seal that reduces flow through the tunnel to control the amount of byproducts that enter the tunnel.

24 Claims, 11 Drawing Sheets

DOOR ASSEMBLY FOR SUBSTRATE PROCESSING CHAMBER

CROSS-REFERENCE TO RELATED APPLICATION

This application claims the benefit under 35 U.S.C. §119 (e) of U.S. Provisional Patent Application No. 61/142,121 filed Dec. 31, 2008, which is incorporated herein by reference in its entirety.

BACKGROUND

1. Technical Field

This invention relates to substrate processing chambers and, in particular, to door assemblies for controlling the formation of deposits within tunnels of the door assemblies.

2. Description of the Related Art

Wafer etching processes performed within conventional processing chambers often result in the accumulation of etch byproducts on walls of the processing chambers, as well as on other exposed components. Accumulated byproducts can impair processing quality and can reduce overall processing efficiency, thereby leading to reduced throughput. For example, solid polymer byproducts often form deposits at the tops of door tunnels. These deposits tend to peel and form flakes. Additional polymer byproduct may be deposited on the flakes and cause additional peeling that ultimately results in large hanging formations commonly referred to as "stringers." Stringers may obstruct door tunnels and may scratch the top surfaces of wafers. These types of scratches may result in a significant yield loss, for example, about a 5% yield loss per each scratched wafer. FIG. 1 shows a stringer 50 hanging downwardly into a door tunnel 54. If the stringer 50 is not removed, it may continue to peel away to further reduce the amount of clearance in the door tunnel 54. It may be difficult to load and unload the chamber without damaging wafers, especially if more than one stringer forms along the tunnel 54.

Fabrication processes, such as metal etching, tend to produce significant amounts of byproducts that lead to the formation of stringers. For example, stringers often form in the door tunnels of plasma etching chambers. Processing gases are contained in plasma etching chambers, while radio frequency (RF) power is used to ignite the processing gases. The ignited processing gases form plasma that etches a targeted layer (e.g., a metal layer) of the wafer. These etching processes often result in etch byproducts that produce relatively large stringers within about a few hundred RF hours. Door tunnels of plasma etching chambers are frequently cleaned to remove these stringers. In some conventional metal etchers, stringers that extend downwardly a distance D (see FIG. 1) greater than or equal to about 3 cm may be produced in less than about 500 RF hours.

Leaks can contribute to stringer growth. When a door assembly leaks (for example, leaks between a door and a front face of a chamber), gases flow through the door tunnel towards the leak. Etch byproducts are drawn into and accumulate within the door tunnel. If the leak is detected, it may be difficult to reposition the door to eliminate the leak. Conventional doors may be aligned with the front face of the chamber with a high level of accuracy to maintain a sealed chamber. Unfortunately, it is difficult to open and close door assemblies repeatedly with the required high level of accuracy.

After deposits build up in the processing chambers, cleaning operations, such as dry cleaning operations or wet cleaning operations, are performed. Dry cleaning operations are often unsuitable for removing large buildups, such as stringers in the door tunnels. Wet cleaning operations are performed by opening processing chambers and wiping down interior surfaces of the chambers. Wet cleaning operations result in significant down-time and, thus, reduce processing throughput.

BRIEF SUMMARY

In some embodiments, a processing apparatus includes a door assembly with an entrance adapted to promote sticking of processing byproducts. The entrance includes one or more patterns of features that cooperate to enhance sticking of built-up solid material to ensure that the built-up material remains attached to the entrance. In certain embodiments, a pattern of features is positioned along a tunnel of the entrance. The pattern of features extends across the top of the tunnel or any other portion of the tunnel in which material may be accumulated in the features. The features, in some embodiments, inhibit the formation of stringers or other obstructions that often form in traditional door tunnels. Substrates moved through the tunnel pass below built-up material securely adhered to the features.

In some embodiments, a grid door tunnel and an enlarged door cooperate to minimize, limit, or substantially prevent the formation of hanging deposits in metal etchers, such as 9600 PTX Metal Etchers from Lam Research Corporation of Fremont, Calif. or similar processing systems. The grid door tunnel has grooves in a grid pattern to allow polymer to build up inside the grooves.

A front portion of the grid door tunnel has a wide surface for mating with the door instead of a traditional raised edge. The enlarged door physically contacts the wide surface to form a tighter seal than conventional seals. The seal between the enlarged door and the wide surface is easily maintained with little to no adjustment to the door. This further inhibits or prevents the formation of stringers.

In some embodiments, an entrance of a semiconductor processing apparatus includes a plurality of means for sticking processing material to the entrance to inhibit stringer formation. The plurality of means for sticking are formed in a portion of the entrance defining a tunnel. In certain embodiments, the plurality of means for sticking include geometric features that include at least one of a U-shaped groove, a V-shaped groove, and a rectangular groove. The grooves are integrally formed in the entrance via a machining process.

DETAILED DESCRIPTION

Figure 2:
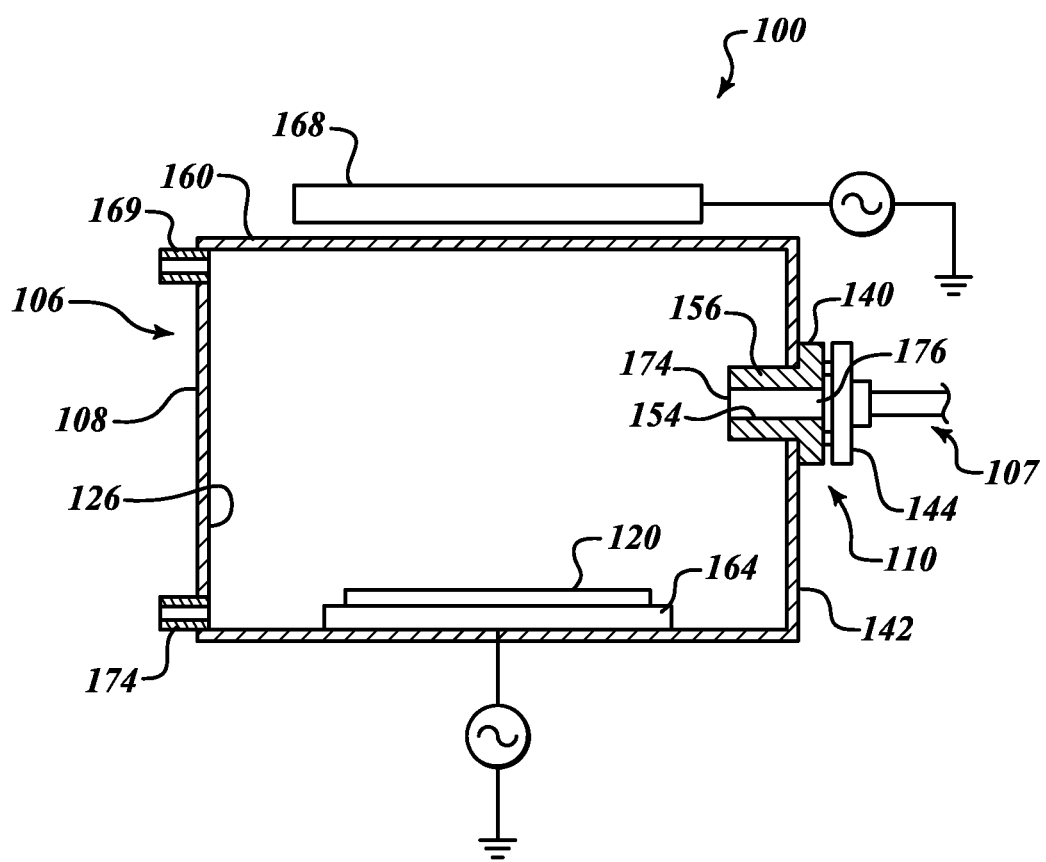
FIG. 2 is a cross-sectional view of a substrate processing apparatus having features of the present invention.

FIG. 2 shows a substrate processing apparatus 100 including a processing chamber 106 and a door handler 107. The processing chamber 106 includes an enclosure 108 and a door assembly 110. The enclosure 108 defines a reaction chamber 126. The door assembly 110 includes a substrate entrance 140 coupled to and extending through a front wall 142 of the enclosure 108. The door handler 107 moves a door 144 of the door assembly 110 between an open position for moving substrates into and out of the processing chamber 106 and a closed position (illustrated in FIG. 2) for sealing the chamber 126. In this manner, the processing chamber 106 can be opened and closed.

The entrance 140 includes a door tunnel 154 that can remain unobstructed and generally stringer free for a much longer time than conventional door tunnels to reduce the frequency of cleaning operations, reduce yield losses, and allow the use of large substrate handlers. Solid material buildup within the tunnel 154 can be controlled to maintain a desired amount of tunnel clearance. If material is deposited on a portion 156 of the entrance 140 defining the tunnel 154, the deposited material sticks to the portion 156 to reduce, limit, or substantially eliminate, for example, peeling, flaking, and/or the formation of stringers. The entrance 140 can therefore appreciably reduce or eliminate the frequency of damage to substrates during transport into and out of the chamber 126 to avoid yield losses. Additionally, a wide range of different types of substrates (for example, 200 mm wafers, 300 mm wafers, or the like) may be conveniently moved through the tunnel 154 using different types of substrate handlers, including, without limitation, paddles, wands, or the like, with different shapes and configurations.

To process a substrate, the door handler 107 moves the door 144 to the open position. A substrate is moved through the tunnel 154 into the reaction chamber 126. The substrate is placed on a substrate holder 164. The illustrated substrate holder 164 is holding a substrate 120 in the form of a wafer. The processing chamber 106 of FIG. 2 is a plasma etching chamber and includes a dielectric plate 160, the substrate holder 164, and an inductive coil 168. Etchant gases are delivered through an inlet 169 into the chamber 126. The etchant gases can be drawn out via an outlet 174. RF power is coupled to the etchant gases by applying currents to the inductive coil 168 and the holder 164 to produce plasma. The plasma is used to etch metal or other materials of the substrate 120. During metal etching, processing byproducts may accumulate on exposed surfaces of the processing chamber 106. These processing byproducts include, without limitation, substrate material, polymers, etchants, resists, combinations thereof, or other secondary or incidental products to substrate processing capable of forming solid deposits. Polymers may be metal based polymers, photoresist based polymers, combinations thereof, or the like.

Figure 3:
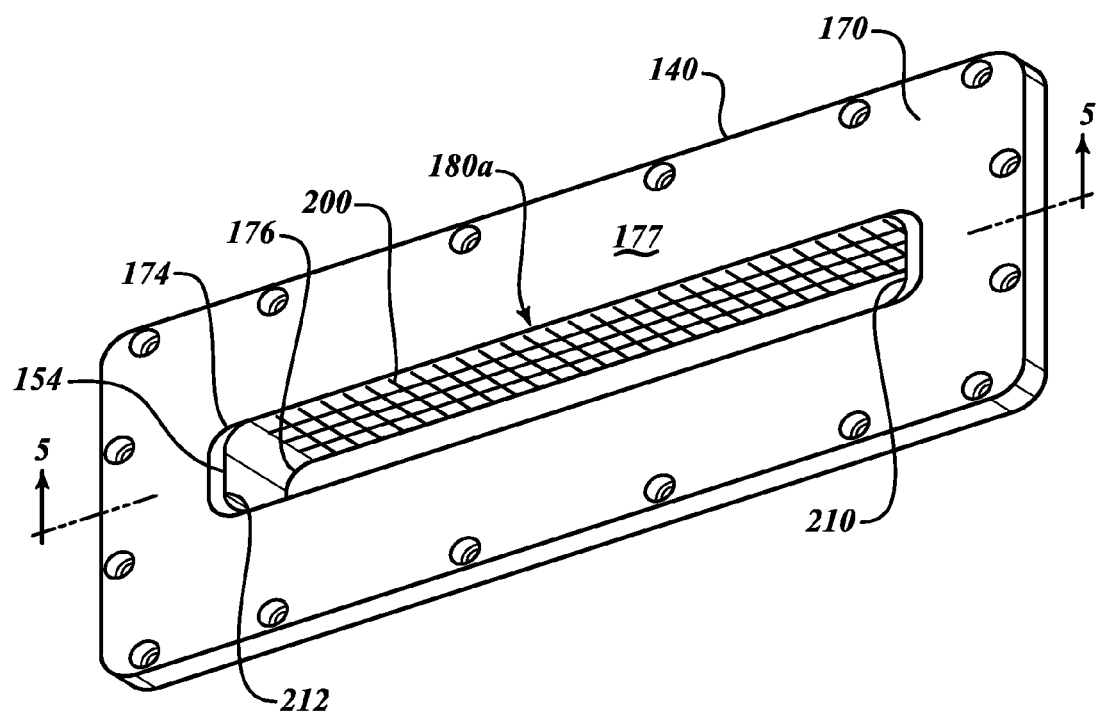
FIG. 3 is a front, bottom, and right side view of an entrance of the substrate processing apparatus of FIG. 2.
Figure 4:
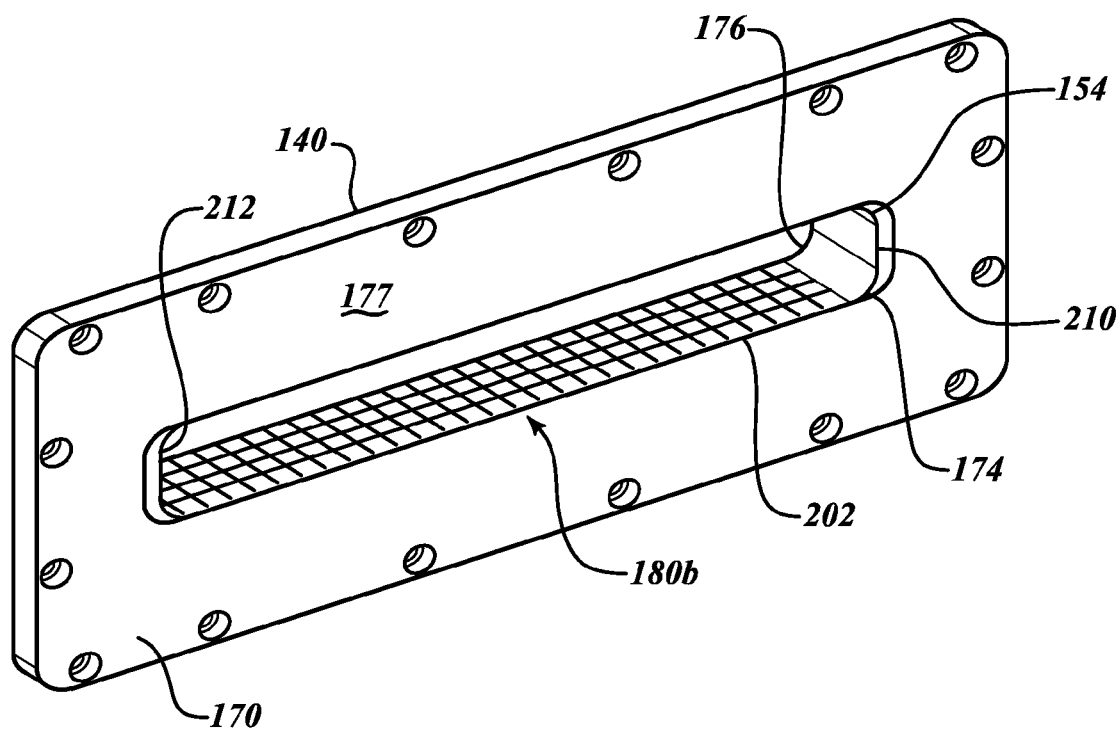
FIG. 4 is a front, top, and left side view of the entrance of FIG. 2.

A pattern of geometric features is positioned along the tunnel 154. Processing byproducts stick (e.g., adhere or otherwise attach) to these geometric features, which can include, without limitation, positive features, negative features, or both. Positive features include, without limitation, fins, protuberances, or other structures that extend into the tunnel 154. Negative features include, without limitation, grooves, indentations, or other features capable of being filled with solid processing byproducts. FIGS. 3 and 4 show negative features 180*a*, 180*b* (collectively "180") in the form of U-shaped interconnected grooves defining grids. The features 180 can be integrally formed in the entrance 140 via a machining process, or any other suitable manufacturing process. Machining processes include, but are not limited to, milling, engraving, waterjet cutting, or the like.

Figure 5:
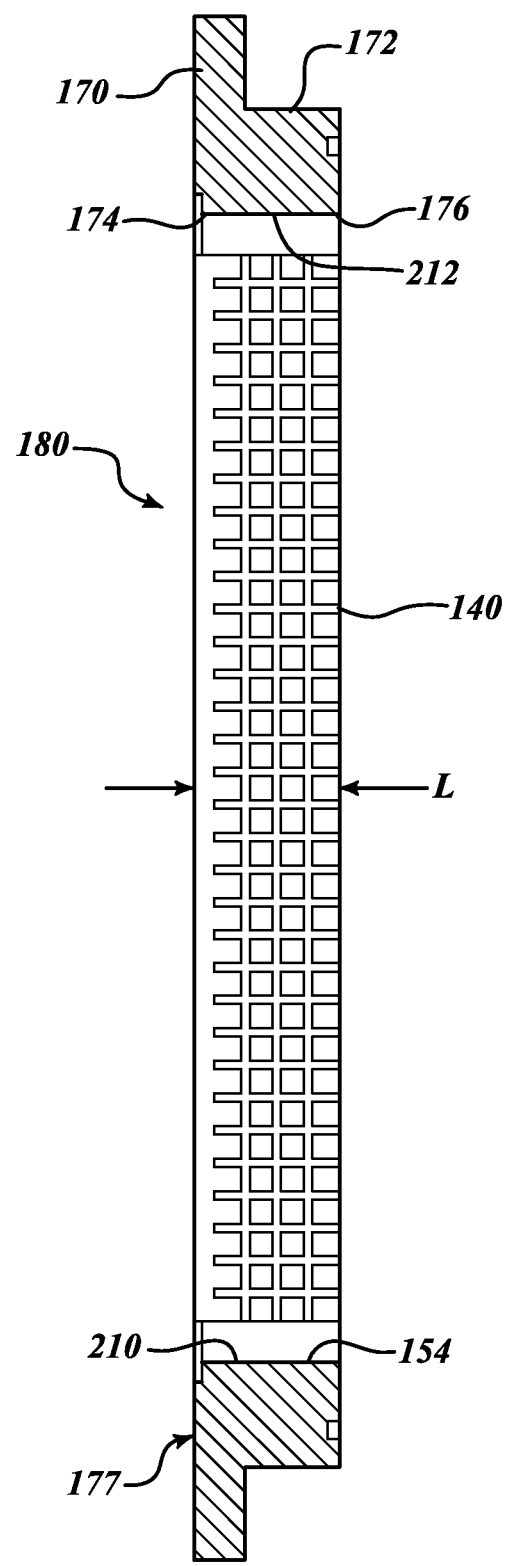
FIG. 5 is a cross-sectional view of the entrance of FIG. 3 taken along a line 5-5.

Referring to FIGS. 3-5, the entrance 140 includes a door mating region 170 and a main body 172 extending away from the door mating region 170. The door mating region 170 has a front face 177. The tunnel 154 has a first end 174 and a second end 176 opposing the first end 174. The features 180*a*, 180*b* extend across a tunnel ceiling 200 (FIG. 3) and a tunnel floor 202 (FIG. 4), respectively, between the first and second ends 174, 176. In some embodiments, the features 180 extend along most or substantially all of a distance between the first and second ends 174, 176. Additionally or alternatively, the features 180 can extend across most or substantially all of a distance between tunnel sidewalls 210, 212. A front edge of the entrance may be free from the features 180 to inhibit buildup proximate the door. For example, the features 180 can be spaced from a front edge of the entrance by a distance of about 0.15 inch (3.81 mm). Material can accumulate in the features 180 above and below a substrate path of travel to maximize tunnel clearance.

FIG. 5 illustrates generally regularly spaced perpendicular discrete features 180. The features 180 are arranged in a regularly repeating pattern, such that there is generally uniform spacing between a first set of the features parallel to a length L of the tunnel 154, and there is uniform spacing between a second set of features substantially perpendicular to the features of the first set. When the feature spacing is uniform, each feature 180 of the first set is set apart by a first distance, while each feature 180 of the second set is set apart by a second distance. The first distance can be less than, equal to, or greater than the second distance.

The features 180 can form a wide range of patterns, including, but not limited to, a grid pattern, a diamond pattern, a wave pattern, a zig-zag pattern, a pattern of geometric shapes, a pattern of parallel features, combinations thereof, or other types of predetermined patterns. The type and configuration of the pattern can be selected based on the desired forces required to remove (for example, via peeling) solid deposits of byproducts. In some embodiments, multiple patterns of features are located at discrete regions prone to stringer formation, or the formation of other types of unwanted obstructions, to reduce the total number of features. This embodiment may be conveniently cleaned because of the limited regions in which byproducts accumulate. Alternatively, the entire or most of the surface of the portion 156 can include a pattern of features.

Byproducts that enter the tunnel 154 tend to collect in the features 180. The features 180 are close together, such that more byproduct by weight accumulates within the features 180 than on the surfaces between the features 180. The ceiling features 180*a* are especially well suited to inhibit peeling and the formation of stringers. Mechanical adhesion between the features 180*a* and the built-up material keeps the built-up material in the features 180*a*. In some embodiments, the tunnel 154 may be kept substantially free from any stringers or free from a significant number of stringers for at least a few hundred RF hours. The features 180, in some embodiments, can thus increase the period of time between clean operations to more than about 1200 RF hours as compared to 375 RF hours for conventional chambers. In certain embodiments, the tunnel 154 is kept substantially free of stringers for at least about 500 RF hours. In yet other embodiments, the entrance 140 is substantially free of any stringers for at least about 800 RF hours, 1,000 RF hours, 1,300 RF hours, or 1,500 RF hours.

After material is built up in the tunnel 154, the entrance 140 can be conveniently removed from the enclosure 108 and cleaned. The clean entrance 140 is then reinstalled in the enclosure 108, or another enclosure. Cleaning processes are periodically performed to keep the tunnel 154 free from excessive buildup. Conventional door tunnels with a grind finish (e.g., a 0.2 grind finish) cannot be repeatedly cleaned because the grind finish is significantly destroyed during cleaning processes. In contrast, the entrance 140 is capable of being cleaned a number of times without appreciably altering its performance.

Dimensions of the pattern may be selected based on dimensions of average flakes that would form without the pattern. To determine appropriate feature dimensions, an entrance without features can be used until there is significant flaking. The dimensions of the flakes can be measured and used to determine an average flake length. If the average length is about 0.05 inch (1.3 mm), the width W of the feature 180, feature pitch, or other dimensions can be less than or equal to about 0.05 inch (1.3 mm). The distances between adjacent features can be reduced if unwanted peeling occurs. In some embodiments, the pitch of the features is about 0.2 inch (5.1 mm). In some embodiments, the pitch is in a range of about 0.1 inch to about 0.3 inch. In certain embodiments, the width W is about 0.07 inch (1.8 mm)+/−0.02 inch (0.5 mm) and the depth D is about 0.1 inch (2.5 mm) or 0.05 inch (1.3 mm). In some embodiments, the average width of the features 180 is no greater than about 0.1 inch. Other dimensions are also possible. The depths of the features 180 are selected based on the desired lengths of time between cleaning operations. The illustrated feature 180 of FIG. 6 can have a depth D less than or equal to about 0.1 inch (2.5 mm) to provide about 1,000 RF hours of processing before a cleaning operation should be performed. The pattern can be wider than the substrate to be processed to ensure there is an unobstructed path of travel through the tunnel 154. Different empirical and numerical techniques can be used to determine optimal tunnel and feature dimensions and configurations.

Figure 1:
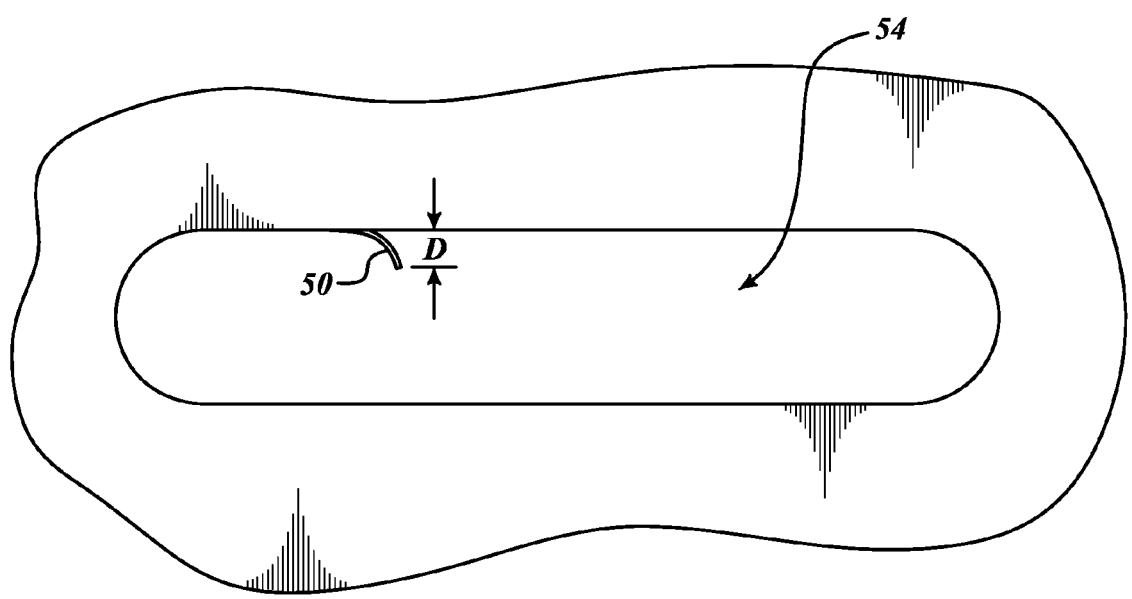
FIG. 1 is an elevational view of a hanging stringer in a conventional door tunnel.
Figure 6:
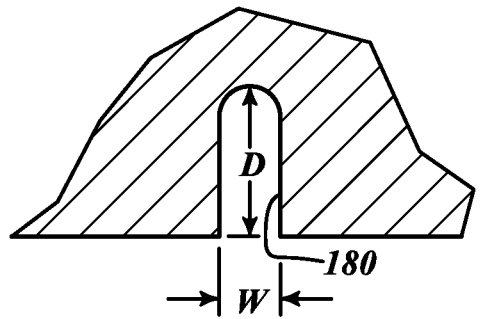
FIG. 6 is a cross-sectional view of an empty geometric feature illustrating one aspect of the present invention.
Figure 7:
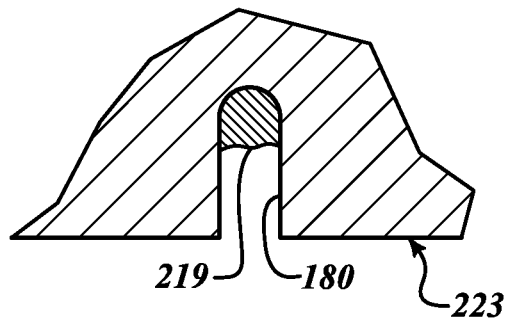
FIG. 7 is a cross-sectional view of the geometric feature of FIG. 6 partially filled with built-up processing byproducts.
Figure 8:
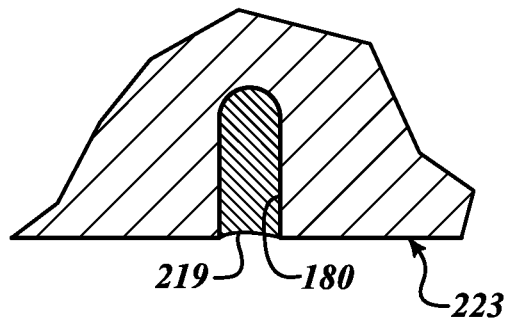
FIG. 8 is a cross-sectional view of the geometric feature of FIG. 6 completely filled with built-up processing byproducts.

FIGS. 6-9 show the feature 180 being filled. FIG. 6 illustrates the empty feature 180. During processing, byproducts inside of the chamber 126 of FIG. 1 enter the tunnel 154 and begin to accumulate within the feature 180. By way of example, for plasma etching, a mask is applied to the substrate 120. RF power is applied to the inductive coil 168 and the holder 164 to create plasma that etches selected areas defined by the mask. Metal based polymer, as well as mask (e.g., photoresist or other type of mask material) based polymers or other byproducts, may begin to accumulate on the inner surfaces of the enclosure 108. These processing materials also enter the tunnel 154 and accumulate in the features 180. FIG. 7 shows the feature 180 partially filled with processing material 219 after about 100 RF hours to about 300 RF hours. A surface 223 adjacent the feature 180 can be substantially free of any appreciable amount of deposited byproduct. In some embodiments, processing material may be deposited on the surface 223, while the feature 180 is filled; however, the processing material on the surface 223 may be kept below a level that would induce peeling. The partially filled feature 180 continues to be filled with additional byproducts until the feature 180 is mostly or completely filled.

Figure 9:
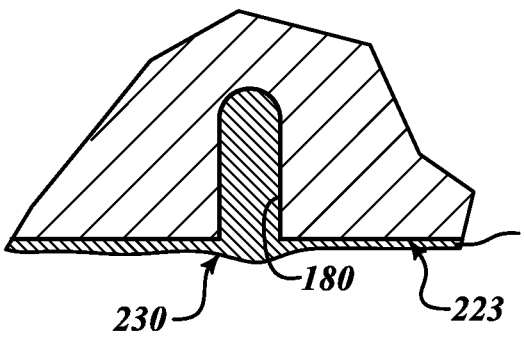
FIG. 9 is a cross-sectional view of the geometric feature of FIG. 6 covered by built-up processing byproducts.
Figure 10:
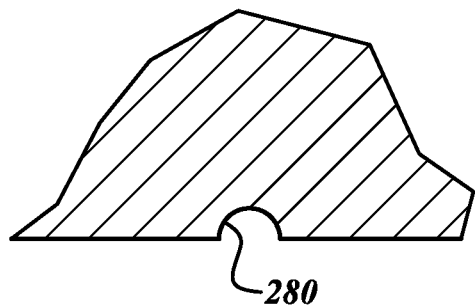
FIGS. 10-13 are cross-sectional views of different feature configurations.
Figure 11:
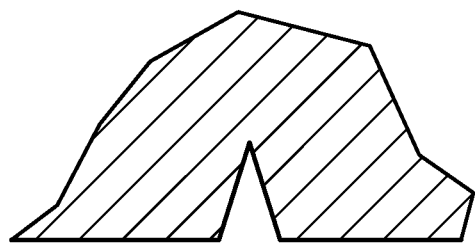
Figure 12:
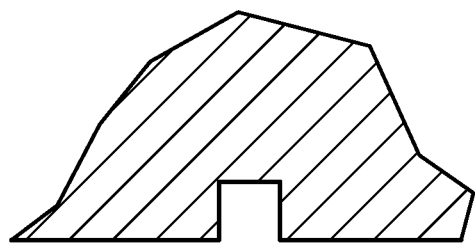
Figure 13:
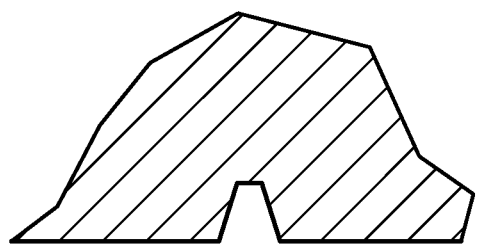

FIG. 9 shows the feature 180 completely filled with processing byproduct after about 300 RF hours to about 1,000 RF hours. An operator can visually inspect the feature 180 to determine whether it is completely filled. Deposited processing material extends across the feature 180 and the surface 223 to form a layer 228. The layer 228 has a generally flat outer surface 230 on which additional material can be deposited. The illustrated surface 230 is substantially free of discontinuities (e.g., flakes) that may lead to the formation of stringers. Thus, a significant amount of material can be deposited on the layer 228 without forming obstructions in the tunnel 154. This type of material buildup does not reduce clearance through the tunnel 154 to any significant extent, thereby providing enhanced tunnel clearance.

Figure 14:
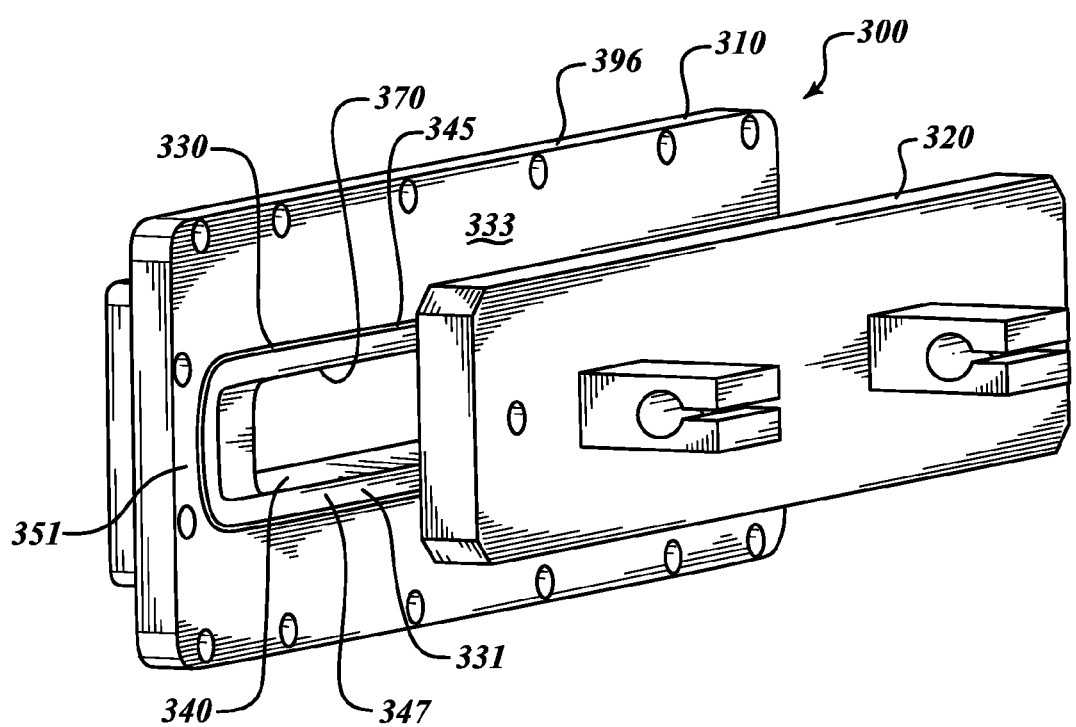
FIG. 14 is a pictorial view of a door assembly in an open configuration.

Cross-sectional shapes of the features 180 may be U-shaped, V-shaped, polygonal, semi-circular, curved, or combinations thereof. FIGS. 10-13 illustrate a semi-circular cross-section (FIG. 10), a rectangular cross-section (FIG. 11), a V-shaped cross-section (FIG. 12), and a trapezoidal cross-section (FIG. 14). Other shapes and configurations are also possible, if needed or desired. The geometric shapes of the features may be selected based, at least in part, on the characteristics of the processing byproducts, cleaning processes used to clean the features, feature patterns, or the like.

Various processing parameters can be varied to adjust the rate of byproduct accumulation. To increase or decrease the rate of byproduct accumulation, the temperature of the entrance 140 can be decreased or increased. To further reduce or inhibit the formation of large deposits of polymer byproducts, the entrance 140 is heated to a temperature equal to or greater than about 90 degrees Celsius during processing. Other temperatures are also possible, if needed or desired.

The door assembly 110 can be periodically visually inspected to monitor different operating parameters, including accumulation rates of byproducts, location of byproduct buildup, tunnel clearance, or the like. After the features 180 are filled with a desired amount of buildup, the entrance 140 can be cleaned using mechanical techniques. For example, mechanical scrubbers, abrasion devices, or the like can be employed. The features 180 can be repeatedly cleaned using these types of techniques without substantially altering the geometry of the features 180. If the features 180 are grooves machined into the entrance 140, aggressive cleaning techniques unsuitable for repeatedly cleaning traditional surfaces (e.g., surfaces with a grind finish) can be used to repeatedly clean the features 180. In such reusable embodiments, the feature 180 may be cleaned more than about 5 times, 10 times, or 25 times.

Figure 15:
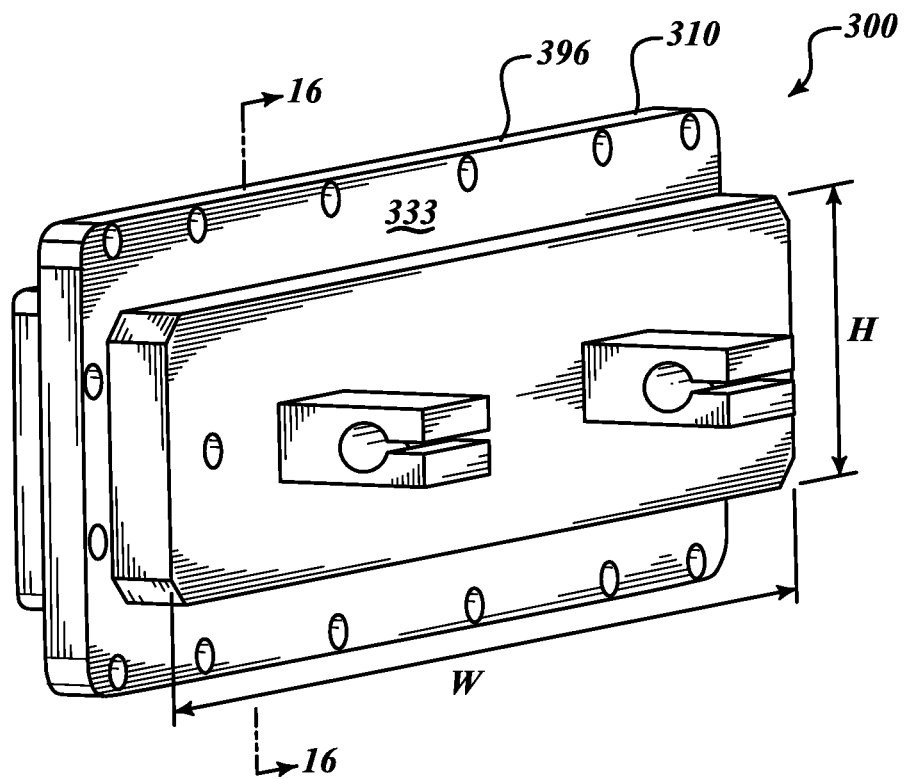
FIG. 15 is a pictorial view of the door assembly of FIG. 14 in a closed configuration.

FIGS. 14 and 15 show a door assembly 300 that includes an entrance 310 and a door 320. The entrance 310 includes a raised sealing portion 330 surrounding a tunnel 340. When the door 320 is moved from an open position (FIG. 14) to a closed position (FIG. 15), the entrance 310 cooperates with the door 320 to form a seal, for example, a fluid tight seal. Leaking can increase the amount of processing byproducts that enter and become deposited in the entrance 310. Leaking, if any, can be kept at or below a desired level so as to control the accumulation of byproducts in the tunnel 340.

The sealing portion 330 includes a strip protruding from a front face 333 of the entrance 310. The sealing portion 330 of FIG. 14 includes an upper portion 345 and a lower portion 347 extending across the top and bottom of the tunnel 340 and sides 351 extending vertically between the horizontally extending upper and lower portions 345, 347. A relatively large sealing surface 331 is provided to reduce the accuracy needed to seat the door 320 against the entrance 310. The sealing portion 330 can have a height of about 0.04 inches to about 0.08 inches (see FIG. 16). In some embodiments, the height H is about 0.06 inch. The width W can be equal to or greater than about three times, four times, five times, or ten times the height H. Conventional doors are often repositioned with respect to a processing chamber to produce desired seals. In contrast, the illustrated door 320 conveniently mates with the sealing portion 330 to form and maintain a seal without readjusting the door 320. Door handlers with different capabilities, including positioning accuracy, can therefore be used with the door assembly 300.

When the door 320 is closed, the sealing portion 330 extends from at least proximate to the tunnel 340 to a sealing member 380 (FIG. 16) of the door 320. In some embodiments, including the illustrated embodiment of FIG. 16, the sealing portion 330 defines an opening 370 of the tunnel 340 and contacts, or almost contacts, the sealing member 380. The distance between the sealing member 380 and the sealing portion 330 can be less than the width of the sealing portion 330. The raised sealing portion 330 can block flow towards a seal 390 formed by the sealing member 380 and the front surface 333. The closed door 320 is vertically and/or horizontally movable with respect to the entrance 310 without producing any appreciable leaks. In some embodiments, the sealing portion 330 fills most or at least substantially all of a gap between the front surface 333 and the door 320.

The sealing member 380 can also physically interact with the sealing portion 330 to position the door 320 with respect to the entrance 310. The sealing member 380 can include, without limitation, one or more compressible members, bladder seals, or other types of sealing devices and can be made, in whole or in part, of one or more polymers, rubbers, foams, elastomer, or the like. In certain embodiments, the sealing member 380 is made of an elastomer, such as perfluoroelastomer, and can have a shape that is similar to the shape of the sealing portion 330, as viewed from the front of the entrance 310, such that the sealing member 380 closely surrounds the sealing portion 330.

The door 320 has an enlarged shape to increase the area of the door that overlays the entrance 310. This ensures that there is sufficient interaction between the entrance 310 and the door 320 for proper sealing. In some embodiments, the door 320 has a height H (FIG. 15) that is generally in a range of about 4 inches to about 6 inches and a width W (FIG. 15) that is generally in a range of about 13 inches to about 14 inches. The area of contact between the door 320 and the entrance 310 can be in a range of about 50 inches$^2$ and about 84 inches$^2$.

Figure 16:
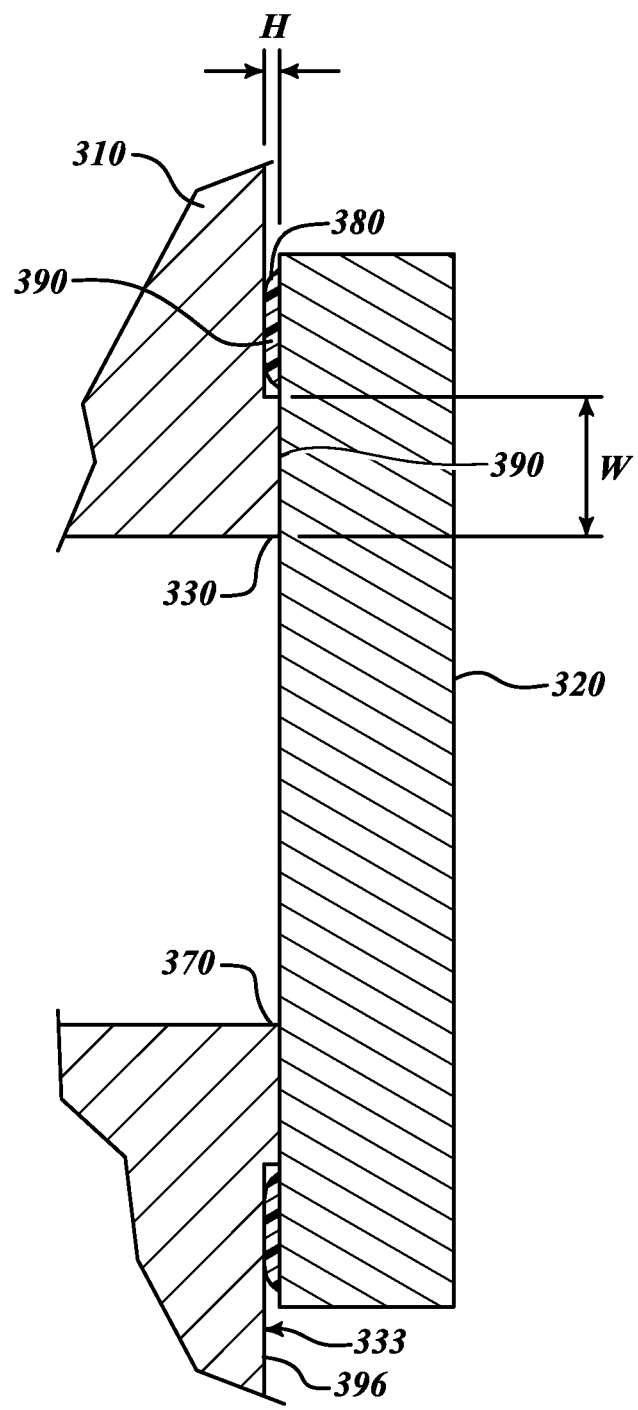
FIG. 16 is a cross-sectional view of the door assembly of FIG. 15 taken along a line 16-16.

The entrance 310 of FIGS. 14-16 has a one-piece construction with the sealing portion 330 monolithically formed with a door mating region 396. In other embodiments, the entrance 310 has a multi-piece construction. For example, the sealing portion 330 is fixedly coupled to the door mating region 396 and can be made of metal, rubber, polymer, combinations thereof, or the like. The entrance 310 can have any number of patterns of features, such as the features 180 discussed above.

Figure 17:
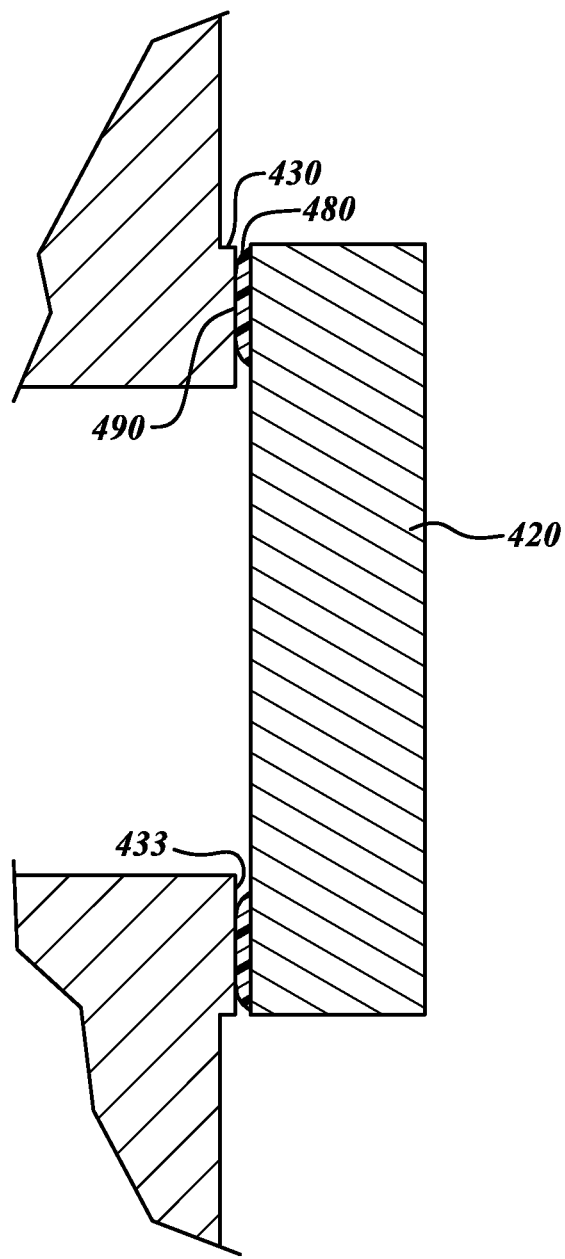
FIG. 17 is a cross-sectional view of a door assembly, in accordance with one aspect of the present invention.

FIG. 17 shows a door 420 with a sealing member 480 that engages a protruding sealing portion 430. A front face 433 of the sealing portion 430 and the sealing member 480 can form a seal 490. The sealing member 480 can be mated with the sealing portion 430 such that substantially all or most of the sealing member 480 overlies the surface 433. The door 420 can be moved towards or away from the sealing portion 430 to achieve the desired seal. In the illustrated embodiment, the sealing portion 430 has a generally flat face 433. In other embodiments, the face 433 can be convex, concave, or the like.

The door assemblies and their components disclosed herein can be used with a wide range of different types of processing apparatuses, include dry or wet etchers (e.g., transformer coupled plasma (TCP) etchers or decoupled plasma source (DPS) etchers), microwave-based etchers (e.g., reactive ion etchers or magnetically enhanced reactive ion etching), chemical vapor deposition chambers, or other types of semiconductor processing chambers. For example, the door assemblies can be incorporated into metal etchers in the form of TCP etchers, DPS etchers, plasma etchers, or the like. Different types of processing apparatuses may have enclosures made, in whole or in part, of metal, quartz, or the like and different types of substrate holders, such as static chucks, mechanical chucks, spiders, susceptors, or the like.

The door assembly dimensions and configurations can be selected based on the types and amount of contaminates produced within the reaction chamber. In some embodiments, the door assemblies are incorporated into cluster tools or other types of multi-chamber semiconductor processing tools. The door assemblies can also be in the form of or include one or more valves (e.g., slit valves, gate valves, or the like) or other types of devices for sealing chambers. In vacuum applications, the door assembly can be a slit valve. In non-vacuum applications, the door assembly can be a gate valve. The door assemblies disclosed herein can be modified for different applications. The configuration and design of the patterned features of the entrances can be selected based on the configuration of the door assembly and its components.

Various methods and techniques described above provide a number of ways to carry out the invention. There is interchangeability of various features from different embodiments disclosed herein. Similarly, the various features and acts discussed above, as well as other known equivalents for each such feature or act, can be mixed and matched by one of ordinary skill in this art to perform methods in accordance with principles described herein. Additionally, the methods which are described and illustrated herein, such as methods of cleaning, processing, and the like, are not limited to the exact sequence of acts described, nor are they necessarily limited to the practice of all of the acts set forth. Other sequences of events or acts, or less than all of the events, or simultaneous occurrence of the events, may be utilized in practicing the embodiments of the invention.

Although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, it is not intended that the invention be limited, except as by the appended claims.

What is claimed is:
1. A substrate processing apparatus, comprising:
an enclosure defining a reaction chamber;
a substrate holder in the reaction chamber; and
a door assembly comprising:
   a substrate entrance having a front face in a first plane and a tunnel extending from the front face to the reaction chamber, the tunnel having an inner surface,
   a door movable with respect to the substrate entrance to open and close the reaction chamber,
   a pattern of features spaced apart from one another and located along a portion of the substrate entrance defining the tunnel, the pattern of features being configured to promote sticking of processing byproducts to the substrate entrance, an annular sealing member coupled to the door and located between the front face of the substrate entrance and the door and contacting the front face of the substrate entrance in the first plane when the reaction chamber is closed and configured to form a seal between the front face of the substrate entrance and the door, and an annular raised sealing portion positioned on the front face of the substrate entrance, protruding beyond the first plane, and configured to mate with the door in a second plane, the raised sealing portion being interposed between the sealing member and the tunnel and having a sidewall that is co-planer with the inner surface of the tunnel.

2. The substrate processing apparatus of claim 1, wherein the features are grooves integrally formed in the portion of the substrate entrance.

3. The substrate processing apparatus of claim 1, wherein the pattern of features includes a grid of interconnected grooves.

4. The substrate processing apparatus of claim 1, wherein at least one of the features has a width less than or equal to about 0.1 inch and a depth less than or equal to about 0.07 inch.

5. The substrate processing apparatus of claim 1, wherein the substrate processing apparatus is a metal etcher.

6. The substrate processing apparatus of claim 1, wherein the raised sealing portion has an upper portion above the tunnel and a lower portion below the tunnel, the upper portion extends along most of a distance between the tunnel and an upper portion of a sealing member of the door, and the lower portion extends along most of a distance between the tunnel and a lower portion of the sealing member of the door.

7. The substrate processing apparatus of claim 1, wherein the first plane and the second plane are parallel to each other.

8. The substrate processing apparatus of claim 1, wherein the first plane and the second plane are separated by a distance of about 0.04 inches to about 0.08 inches.

9. A door assembly for a semiconductor processing apparatus, comprising:
a door;
an annular sealing member located on the door; and
a substrate entrance including:
a main body having a front face in a first plane, and
a tunnel extending through the main body, the tunnel including a first end, a second end opposing the first end, and a sidewall between the first and second end,
an annular raised sealing portion positioned on the front face of the main body surrounding the first end of the tunnel and having a sidewall that is co-planar with the sidewall of the tunnel and configured to protrude beyond the first plane and mate with the door in a second plane, the raised sealing portion having a width that is equal to or greater than about ten times a height of the raised sealing portion above the front face of the main body,
the annular sealing member on the door configured to form a seal with the front face of the main body, contact the front face at the first plane, and being located in a position on the door that when the front face of the main body forms a seal with the annular sealing member the raised sealing portion is located between the annular sealing member and the tunnel, and
a plurality of discrete geometric features positioned along the tunnel and structured to promote sticking of processing material to the substrate entrance.

10. The door assembly of claim 9, wherein the plurality of discrete geometric features form a pattern that extends between the first end and the second end and across most of the tunnel, the discrete geometric features are structured to accumulate processing material that enters the first end of the tunnel to buildup the processing material within the discrete geometric features.

11. The door assembly of claim 9, wherein a pitch of at least some of the geometric features is in a range of about 0.1 inch to about 0.3 inch.

12. The door assembly of claim 9, wherein the plurality of discrete geometric features are located along a ceiling of the tunnel.

13. The door assembly of claim 9, wherein the plurality of discrete geometric features is a pattern of grooves, the pattern extending along most of a distance between the first end and the second end of the tunnel and a width of the tunnel.

14. The door assembly of claim 9, wherein the plurality of discrete geometric features defines a pattern that extends between sides of the tunnel.

15. The door assembly of claim 9, wherein the geometric features include at least one of a U-shaped groove, a V-shaped groove, and a rectangular groove.

16. The door assembly of claim 9, wherein the geometric features are configured to be filled with processing material produced within a semiconductor processing apparatus in which the door assembly is installed to inhibit stringer formation along the tunnel.

17. The door assembly of claim 9 wherein, when the door is closed, a distance between the raised sealing portion and the sealing member is less than the width of the raised sealing portion.

18. The door assembly of claim 9 wherein the substrate entrance is configured to be heated above ambient temperature.

19. An entrance of a semiconductor processing apparatus, comprising:
a main body having a face in a first plane;
a tunnel extending through the main body;
an annular raised sealing portion positioned on the face of the main body surrounding the tunnel and configured to mate with a door of the semiconductor processing apparatus at a second plane, and the annular raised sealing portion protruding beyond the first plane and having a width that is equal to or greater than about ten times a height that the annular raised sealing portion protrudes beyond the first plane of the face of the main body;
an annular sealing member coupled to the door and configured to form a seal between the front face of the substrate entrance and the door and to contact the door at the second plane, the raised sealing portion being interposed between the sealing member and the tunnel and defining an opening of the tunnel; and
a plurality of means for sticking processing material to the main body to inhibit stringer formation, the plurality of means for sticking formed in a portion of the main body defining and extending along the tunnel.

20. The entrance of claim 19, wherein the plurality of means for sticking are sufficiently deep to be filled up with processing material buildup that is generated during at least 500 RF hours of metal etching.

21. The entrance of claim 19, wherein the means for sticking extend across the tunnel.

22. A door assembly for a semiconductor processing apparatus, comprising:
- a substrate entrance including:
  - a main body,
  - a tunnel extending through the main body, the tunnel including a first end, a second end opposing the first end, and a sidewall, and
  - an annular raised sealing portion positioned on a front face of the main body and defining an opening at the first end of the tunnel and having a sidewall that is co-planer with the sidewall of the tunnel, the front face of the main body having a first plane and the annular raised sealing portion protruding from the first plane; and
  - a door for closing the tunnel and having an annular sealing member attached to the door, the annular sealing member positioned so that when the door is closed over the first end of the tunnel, the annular raised sealing portion is located between the sealing member and the first end of the tunnel, the annular sealing member contacts the front face of the main body at the first plane and forms a fluid tight seal, and the annular raised sealing portion configured to mate with the door in a second plane.

23. The door assembly of claim 22 wherein, when the door is closed, the raised sealing portion substantially fills a gap between the front face of the body and the door.

24. The door assembly of claim 22 wherein the raised sealing portion has a width that is equal to or greater than about ten times a height of the raised sealing portion above the face of the main body.

\* \* \* \* \*